(12) United States Patent
Cheng et al.

(10) Patent No.: US 10,191,096 B2
(45) Date of Patent: Jan. 29, 2019

(54) ELECTRIC VEHICLE DISAGGREGATION AND DETECTION IN WHOLE-HOUSE CONSUMPTION SIGNALS

(71) Applicants: Hsien-Ting Cheng, San Jose, CA (US); Ye He, Mountain View, CA (US); Abhay Gupta, Cupertino, CA (US); Vivek Garud, Cupertino, CA (US); Alex Shyr, Mountain View, CA (US)

(72) Inventors: Hsien-Ting Cheng, San Jose, CA (US); Ye He, Mountain View, CA (US); Abhay Gupta, Cupertino, CA (US); Vivek Garud, Cupertino, CA (US); Alex Shyr, Mountain View, CA (US)

(73) Assignee: Bidgely Inc., Mountain View, CA (US)

( * ) Notice: Subject to any disclaimer, the term of this patent is extended or adjusted under 35 U.S.C. 154(b) by 831 days.

(21) Appl. No.: 14/612,499

(22) Filed: Feb. 3, 2015

(65) Prior Publication Data

US 2016/0223597 A1     Aug. 4, 2016

(51) Int. Cl.
*G06F 11/30*     (2006.01)
*G01R 21/133*    (2006.01)
*B60L 11/18*     (2006.01)
*G01R 19/25*     (2006.01)

(52) U.S. Cl.
CPC ........ *G01R 21/133* (2013.01); *B60L 11/1848* (2013.01); *G01R 19/2513* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 20/38* (2013.01); *Y04S 30/14* (2013.01)

(58) Field of Classification Search
CPC ..................................................... G01R 21/133
See application file for complete search history.

(56) References Cited

U.S. PATENT DOCUMENTS 9,612,286 B2 *   4/2017   Gupta ................... G01R 31/34
2012/0078547 A1* 3/2012   Murdoch ............... G01D 4/004
                                                            702/62

* cited by examiner

*Primary Examiner* — Phuong Huynh
(74) *Attorney, Agent, or Firm* — Landmark Intellectual Property Law, PLLC

(57) ABSTRACT

The present invention is directed to systems and methods of disaggregating and detecting energy usage associated with electric vehicle charging from a whole-house consumption signal. In general, methods of the present invention may include: identifying by an electronic processor potential interval candidates of electric vehicle charging, based at least in part upon long and decreasing patterns; determining by the electronic processor intervals associated with the charging of an electric vehicle, based at least in part on evaluating each potential interval candidate; determining by the electronic processor an initial point of charging for each interval associated with the charging of an electric vehicle; and accounting by the electronic processor for feedback of any incorrectly detected signals.

24 Claims, 4 Drawing Sheets

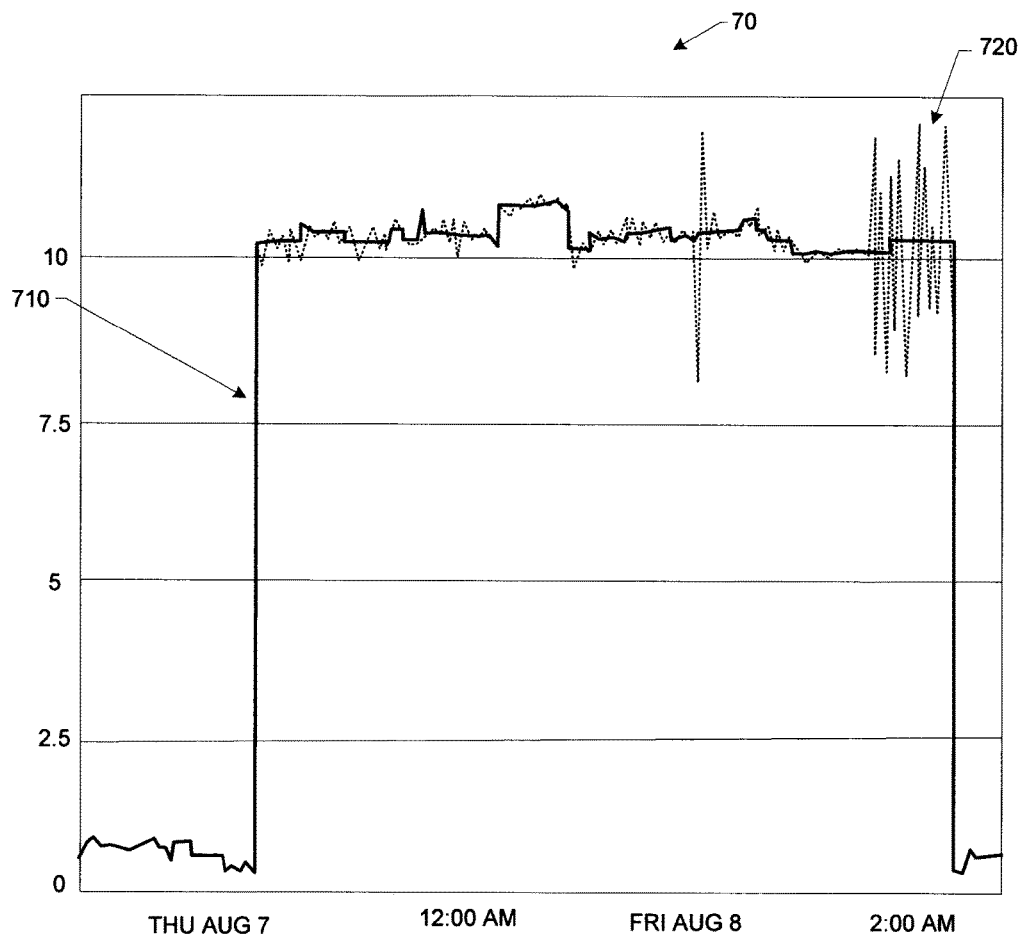

ELECTRIC VEHICLE DISAGGREGATION AND DETECTION IN WHOLE-HOUSE CONSUMPTION SIGNALS

BACKGROUND OF THE INVENTION

In general, the present invention is directed to systems and methods of detecting energy usage associated with charging an electric vehicle. More specifically, the present invention is directed to systems and methods of detecting and disaggregating charging signals associated with electric vehicles from a whole-house profile or consumption signal.

Recent studies show that electric vehicles (EV) have emerged as a major part of the smart grid. While the adoption of EV's may be an important step forward towards a cleaner environment and energy independent society, an average EV owner may expect his or her electricity bill to rise considerably due to the frequent charging required. Accordingly, it is desirable to provide EV users with an interface to better understand the energy costs of EV ownership, as well as to provide additional information and/or features based upon such energy usage.

SUMMARY OF THE INVENTION

Some aspects in accordance with some embodiments of the present invention may include a method of electronically detecting and disaggregating a consumption signal associated with the charging of an electric vehicle from a whole-house profile, comprising: identifying by an electronic processor potential interval candidates of electric vehicle charging, based at least in part upon long and decreasing patterns; determining by the electronic processor intervals associated with the charging of an electric vehicle, based at least in part on evaluating each potential interval candidate; determining by the electronic processor an initial point of charging for each interval associated with the charging of an electric vehicle; and accounting by the electronic processor for feedback of any incorrectly detected signals.

Other aspects in accordance with some embodiments of the present invention may include: a method of electronically detecting and disaggregating a consumption signal associated with the charging of an electric vehicle from a whole-house profile, comprising: identifying by an electronic processor, based at least in part upon long and decreasing patterns, potential interval candidates of electric vehicle charging using sliding windows of various sizes and optimization techniques including dynamic programming, alpha-beta pruning, and/or branch-and-bound algorithms; determining by the electronic processor intervals associated with the charging of an electric vehicle, based at least in part on evaluating each potential interval candidate by fitting each potential interval candidate shape with one or more parametric models; determining by the electronic processor an initial point of charging for each interval associated with the charging of an electric vehicle based at least in part upon identifying upward transitions in the whole-house profile and applying signal processing techniques; receiving feedback from a user of the electric vehicle; and accounting by the electronic processor for feedback of any incorrectly detected signals.

Other aspects in accordance with some embodiments of the present invention may include: a method of electronically detecting and disaggregating a consumption signal associated with the partial charging of an electric vehicle from a whole-house profile, comprising: identifying by an electronic processor potential interval candidates of electric vehicle charging, based at least in part upon features characteristic of previously determined electric vehicle charging; determining by the electronic processor intervals associated with the charging of an electric vehicle, based at least in part on evaluating each potential interval candidate; determining by the electronic processor an initial point of charging for each interval associated with the charging of an electric vehicle; and accounting by the electronic processor for feedback of any incorrectly detected signals.

Other aspects in accordance with some embodiments of the present invention may include: a system for detecting and disaggregating a consumption signal associated with the charging of an electric vehicle from a whole-house profile, comprising: a candidate search module, configured to identify potential interval candidates of electric vehicle charging, based at least in part upon long and decreasing patterns; a parametric fitting module, configured to determine intervals associated with the charging of an electric vehicle, based at least in part on evaluating each potential interval candidate by fitting each potential interval candidate shape with one or more parametric models; an initial point detection module, configured to determine an initial point of charging for each interval associated with the charging of an electric vehicle; and a feedback module, configured to receive feedback associated with detected signals.

Still other aspects in accordance with some embodiments of the present invention may include a method of electronically detecting and disaggregating a consumption signal associated with the charging of an electric vehicle from a whole-house profile, comprising: identifying by an electronic processor potential interval candidates of electric vehicle charging, based at least in part upon identifying box-shaped energy usage patterns; determining by the electronic processor intervals associated with the charging of an electric vehicle, based at least in part on evaluating each potential interval candidate against factors including amplitude, duration, and time-of-day; accounting by the electronic processor for feedback of any incorrectly detected signals.

These and other aspects will become apparent from the following description of the invention taken in conjunction with the following drawings, although variations and modifications may be effected without departing from the scope of the novel concepts of the invention.

BRIEF DESCRIPTION OF THE FIGURES

The present invention can be more fully understood by reading the following detailed description together with the accompanying drawings, in which like reference indicators are used to designate like elements. The accompanying figures depict certain illustrative embodiments and may aid in understanding the following detailed description. Before any embodiment of the invention is explained in detail, it is to be understood that the invention is not limited in its application to the details of construction and the arrangements of components set forth in the following description or illustrated in the drawings. The embodiments depicted are to be understood as exemplary and in no way limiting of the overall scope of the invention. Also, it is to be understood that the phraseology and terminology used herein is for the purpose of description and should not be regarded as limiting. The detailed description will make reference to the following figures, in which:

FIG. 7 illustrates an exemplary signal associated with charging a small-capacity electric vehicle, in accordance with some embodiments of the present invention.

Figure 1:
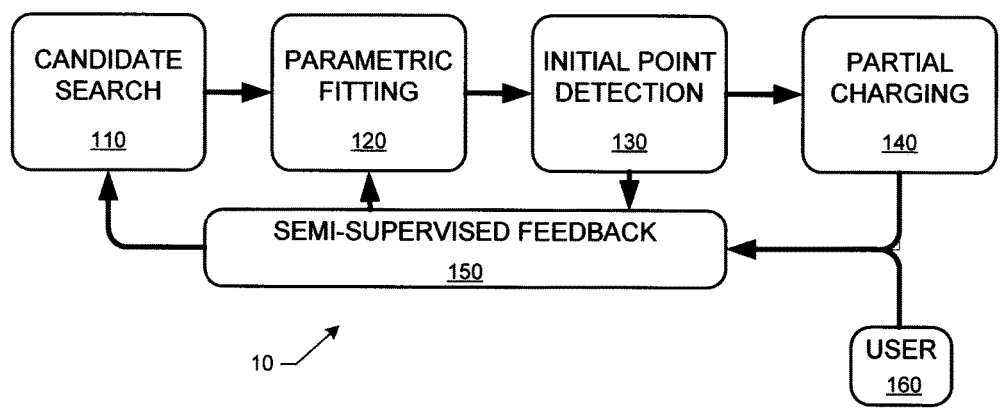
FIG. 1 illustrates an exemplary flow for disaggregating data related to a large-capacity electric vehicle, in accordance with some embodiments of the present invention.

Before any embodiment of the invention is explained in detail, it is to be understood that the present invention is not limited in its application to the details of construction and the arrangements of components set forth in the following description or illustrated in the drawings. The present invention is capable of other embodiments and of being practiced or being carried out in various ways. Also, it is to be understood that the phraseology and terminology used herein is for the purpose of description and should not be regarded as limiting.

DETAILED DESCRIPTION OF THE INVENTION

The matters exemplified in this description are provided to assist in a comprehensive understanding of various exemplary embodiments disclosed with reference to the accompanying figures. Accordingly, those of ordinary skill in the art will recognize that various changes and modifications of the exemplary embodiments described herein can be made without departing from the spirit and scope of the claimed invention. Descriptions of well-known functions and constructions are omitted for clarity and conciseness. Moreover, as used herein, the singular may be interpreted in the plural, and alternately, any term in the plural may be interpreted to be in the singular.

In general, the present invention is directed to systems and methods of detecting energy usage associated with charging an electric vehicle. More specifically, the present invention is directed to systems and methods of detecting and disaggregating charging signals associated with electric vehicles from a whole-house profile or consumption signal. A whole-house profile or consumption signal may be obtained by any suitable method. For example, such information may be collected utilizing a current (CT) clamp, an infrared (IR) sensor, communicating smart meters, an advanced metering infrastructure (AMI) interface, etc.

Note that data resolution from different sources may vary. In order to provide for an accurate disaggregation, data resolution may range from approximately one (1) second to several minutes. In addition to the electrical information of the whole-house profile, non-electrical information may also be utilized in disaggregation processes. For example, weather information (such as, but not limited to, temperature, cloud-cover, etc.) may be considered.

In general, EV's have distinctive charging signatures. In addition to consuming large contiguous blocks of energy, EV's generally exhibit a clear pattern of sloping decay toward the end of charging. This sloping decay is due at least in part to electrochemical properties of battery cells (lithium ion based, or otherwise) used in EVs. As batteries approach a full 100% charge, internal resistance of the battery cells may increase, thereby at least in part leading to lower power consumption.

Moreover, some chargers for EVs may employ a "step charging" method, in which a voltage held across the battery cells may be gradually decreased. Such methods further contribute to the decreasing charging signature.

Note that the type of EV—and the capacity of such EV—may alter the charging signature. For example, large capacity EVs (such as, but not limited to the Tesla Model S) may have the distinctive charging pattern discussed above. In contrast, small capacity EVs (including but not limited to the plug-in Toyota Prius) may have a less distinctive box-shaped signal. Although a box-shaped signal stemming from a low-capacity EV pattern may be simpler to detect simpler, care must be taken to disambiguate the EV signal from other appliances with a similar long-running, box-shaped signatures.

Due to variances in detecting large-capacity EV charging signals from small-capacity EV charging signals, each will be addressed in turn below.

Large Capacity EV

With reference to FIG. 1, an exemplary flow 10 for disaggregating data related to a large-capacity electric vehicle, in accordance with some embodiments of the present invention will now be discussed.

In general, systems and methods in accordance with the present invention make use of patterns that may be distinctive of an EV charging session. Such systems and methods may provide accurate event detection of EV signals in a large and noisy whole-house consumption signal. Moreover, successful detections of full charging sessions—and information or characteristics gleaned therefrom—may be leveraged to assist in identifying partial charging sessions, which may have otherwise been difficult to distinguish.

At 110, a candidate search for potential interval candidates may be performed. Such candidate search may look for signals that generally have a long and decreasing pattern. Although there are multiple ways to identify such long and decreasing patterns that are contemplated by the present invention, one approach may be to use sliding windows of varying sizes. In order to reduce run-time and memory usage, optimization techniques including, but not restricted to, dynamic programming, alpha-beta pruning and branch-and-bound may be utilized.

At 120, each potential identified candidate may be evaluated. Each candidate shape may be fit with parametric models, including but not limited to, log-linear models. Each model may provide a goodness-of-fit confidence, and an ensemble of models may accordingly produce a strong likelihood as to whether the candidate passes the detection, and likely represents charging of a large-capacity EV.

At 130, the initial point of charging (e.g., when charging starts) may be determined. This may be accomplished by scanning the data stream for upward transitions and using signal processing techniques such as smoothing, filtering and change-point detection. Appropriate "begin" candidates (or initial points) may be chosen. Accordingly, the EV signature may be located amidst the whole-house profile.

At 140, partial charging circumstances (e.g., where a full EV charging signature may not be present, or where the downward sloping signature may not be detected) may be accounted for by leveraging prior detections. Features, such as but not limited to amplitude, duration, and/or time-of-day may be extracted from past charging signatures, and then used to classify partial charging signatures. Note that the user 160 may provide input in the feedback loop 150. Such user feedback may increase the accuracy of the detection of EV charging signals.

Using prior detections and/or user-provided ground truth or input, the parameters in noted above pertaining to steps 110, 120, and 130 may be adjusted at 150 (semi-supervised feedback) to correct any incorrectly detected signals. Note that while semi-supervised techniques are illustrated in FIG. 1, it is contemplated that supervised techniques may also be applied.

Proposed Solution Small-Capacity EV

Figure 2:
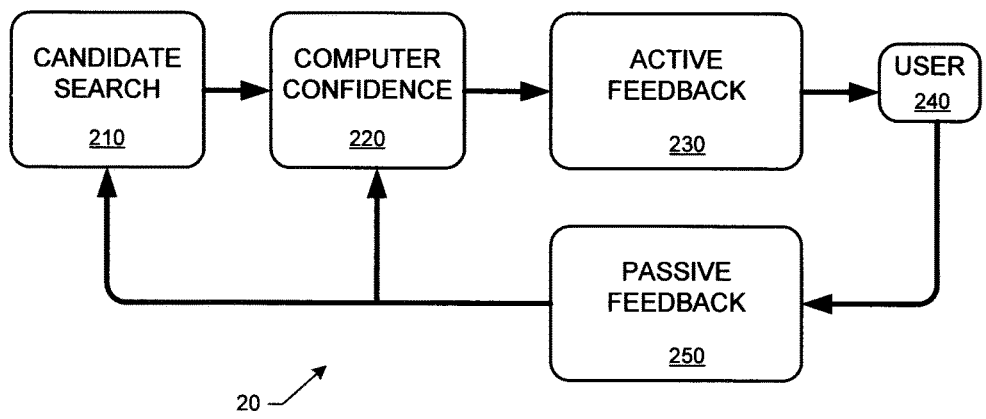
FIG. 2 illustrates an exemplary flow for disaggregating data related to a small-capacity electric vehicle, in accordance with some embodiments of the present invention.

With reference to FIG. 2, an exemplary flow 20 for disaggregating data related to a small-capacity electric vehicle, in accordance with some embodiments of the present invention will now be discussed.

The detection of small-capacity EV charging may be particularly difficult. In general, the charging signal of a small-capacity EV may be somewhat similar to several appliances that may be present within a home (for example, a sump-pump, pool pump, etc.). However, by utilizing user feedback systems and methods in accordance with the present invention may be utilized to detect the EV pattern non-intrusively and collaboratively with the user.

As noted above, small-capacity EVs tend to exhibit a box-shaped charging pattern. At 210, potential interval candidates may be searched. In general, candidates that exhibit a box-shaped pattern—a sharp upward transition with a corresponding downward transition—may be identified.

At 220, each candidate may be evaluated. For example for each candidate a confidence level may be computed, based at least in part on a set of features including, but not restricted to, amplitude, duration and time of day. As will be discussed in more detail below, both active and passive feedback 230, 250 may also be considered in determining confidence levels and identifying instances of low-capacity EV charging.

Active feedback 230 may also be sought. For example, the identified candidates with high confidence may be submitted to the user 240, requesting feedback and/or confirmation of proper identification. Such request and receipt of feedback may be communicated in any number of methods. For example, such communications may be made through a website, web portal, application, software, mobile app, and/or other means. Feedback received from the user may be stored in the system and applied to future detections.

At 250 passive feedback may be obtained. For example, a user may provide general passive information about his or her home. Such information may include a profile of appliances within the home, as well as detailed information about the small-capacity EV. In this manner, the energy usage patterns of existing appliances (such as a pool pump or sump pump) may be differentiated from the EV.

Figure 3:
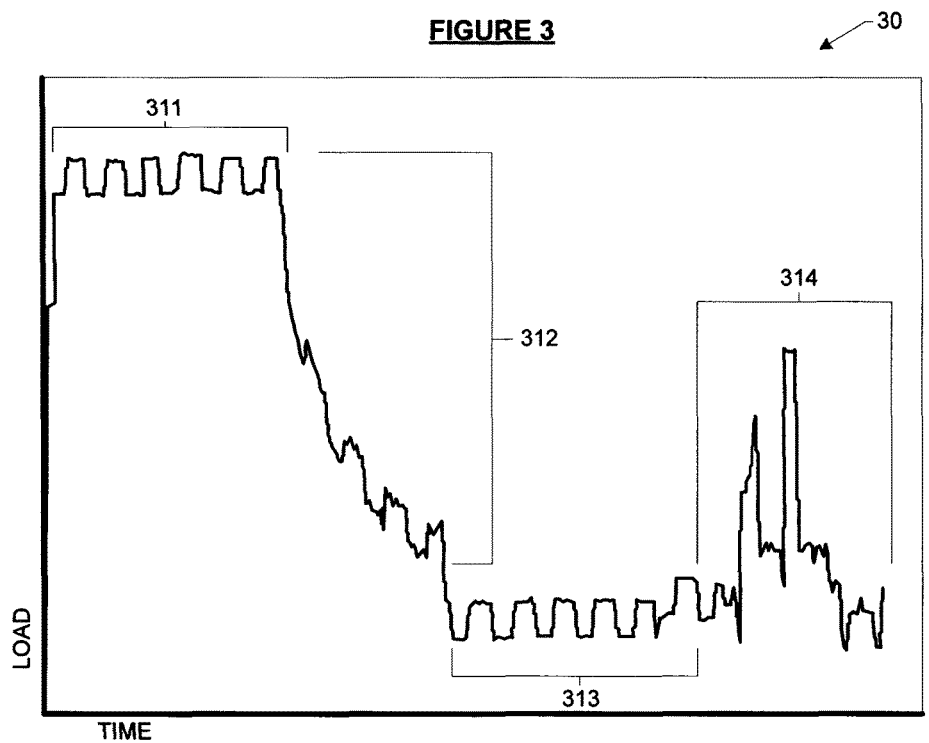
FIG. 3 illustrates an exemplary charging signal from a large-capacity electric vehicle, in accordance with some embodiments of the present invention.

With reference to FIG. 3, an exemplary charging signal 30 from a large-capacity electric vehicle, in accordance with some embodiments of the present invention, will now be discussed. As noted above, large-capacity EVs tend to consume large contiguous blocks of energy, followed by a sloping decay near the end of charging. The portion of the signal denoted at 311 indicates the large contiguous block of energy required by the EV charging. Note that this energy usage is in combination with other energy usage within the home. At 312 the sloping pattern of decay can be identified. At 313, a baseload energy usage for a home may be seen. For example, the repeating block pattern may be due to appliances within the home, such as cycling refrigerators, pool pumps, HVAC units, etc. At 314 a larger energy draw is exhibited. Note the differences, however, between the energy draw at 314 and the identified EV charging pattern exhibited at 311 and 312.

Figure 4:
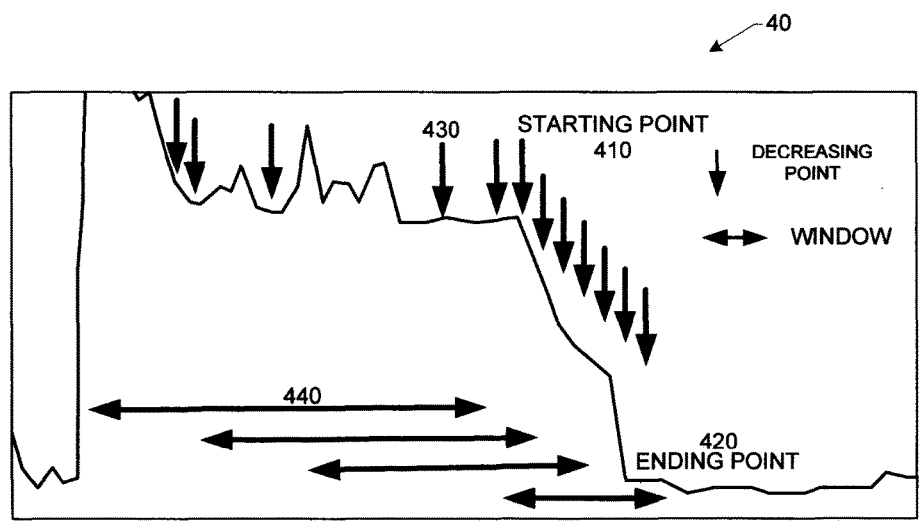
FIG. 4 depicts an exemplary interval candidate search process, in accordance with some embodiments of the present invention.

With reference to FIG. 4, an exemplary interval candidate search process 40, in accordance with some embodiments of the present invention will now be discussed. As discussed, a candidate search may be performed using a sliding window approach. In general, sliding windows 440 of various sizes may be used to identify decreasing points 430. Decreasing patterns of decreasing points may then by identified, from which a starting point 410 and an ending point 420 may be determined.

Figure 5:
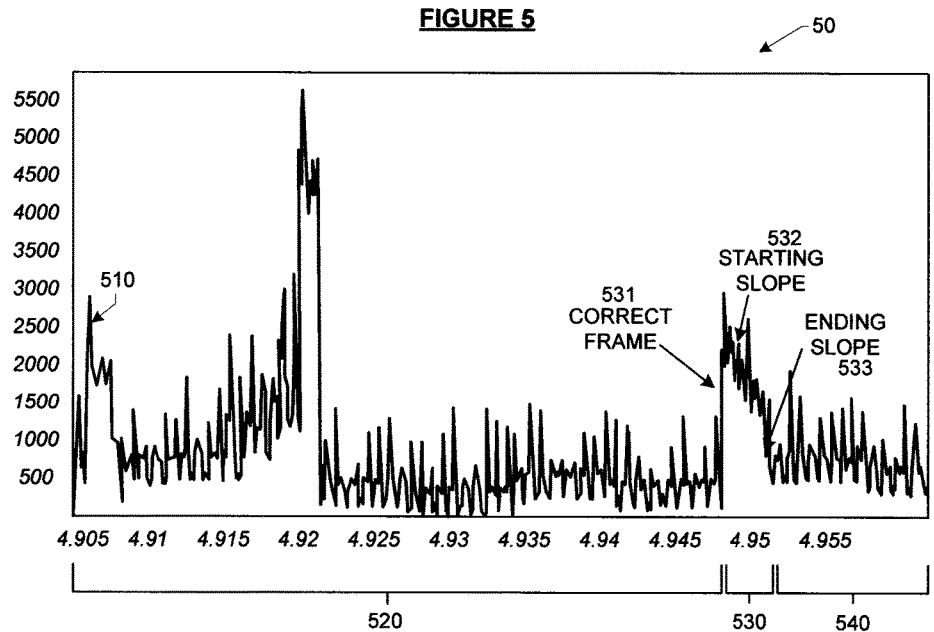
FIG. 5 illustrates an exemplary whole-house profile with a detected electric vehicle charging session, in accordance with some embodiments of the present invention.

With reference to FIG. 5, an exemplary whole-house profile 510 with a detected electric vehicle charging session, in accordance with some embodiments of the present invention will now be discussed. It can be seen that profile 510 reflects varying energy usage from a user home. The portion of the signal denoted at 520 may represent general household usage, which may include some peak loads and cyclical energy usages. At 530, an EV charging session may be identified. At 531 the correct frame may be determined (the start of the charging session). This may be obtained from working backwards after identifying the decreasing or decaying slope, evident between starting slope point 532 and ending slope point 533. Note that after the EV charging session is completed, the general energy loads of the household continue at 540.

Figure 6:
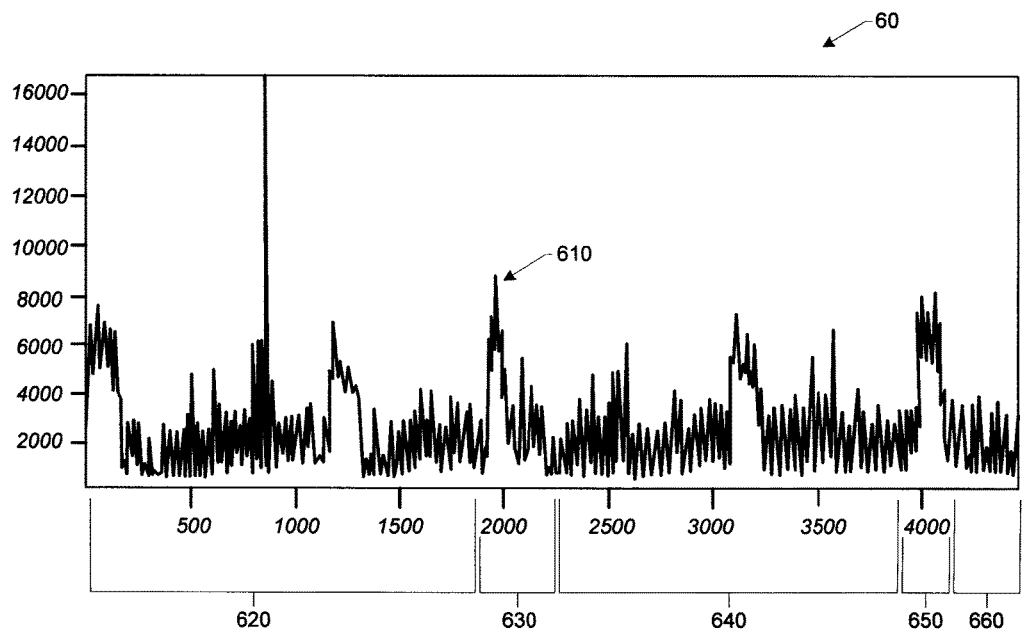
FIG. 6 illustrates an exemplary whole house profile with detected electric vehicle charging sessions, in accordance with some embodiments of the present invention.

With reference to FIG. 6, an exemplary whole house profile with detected electric vehicle charging sessions, in accordance with some embodiments of the present invention, will now be discussed. A whole house profile 610 is seen, illustrating the varying energy uses of a household. Using the systems and methods as discussed above, two (2) different EV charging sessions may be identified from the overall whole house profile 610. Specifically, at 630 and 650, decreasing and decaying energy usage that matches the characteristics of EV charging may be identified. Such peak uses may be characteristically different and distinguishable from peak uses at 620, 640, or 650. Using the present invention, EV charging may accordingly be accurately disaggregated from the relatively noisy, whole-house profile.

With reference to FIG. 7, illustrates an exemplary signal 70 associated with charging a small-capacity electric vehicle, in accordance with some embodiments of the present invention will now be discussed. The signal may exhibit a general box-shaped charging profile 710. Note that the overall profile may vary with spike energy uses 720, but may be smoothed to show the characteristic box profile at 710.

In addition to energy specific information (disaggregated energy usage of EV charging, cost and/or rate plans applied to each specific instance of charging), several other external data sources may be useful in providing the use with specific, actionable information. For example, real-time gas prices, specifics regarding each EV model, location of public (or otherwise available) charging stations and/or any associated cost therewith), etc., may be used by the present invention.

Using systems and methods discussed above, specific energy consumption (and cost) of each EV charging instance, beginning time, ending time, and power amplitude in each charge cycle may be determined. Several applications based on the disaggregated data and other information may be practiced. For example, by detecting the ending time of the last charge, a reminder to charge the EV may be sent to the user. Such reminder may include a note of the estimated miles left before the battery is exhausted. Moreover, if a user typically follows a predictable schedule, EV charging may be initiated just before use so that the EV will have a full—or "topped off" battery before use. Such "charge and go" processes may save battery life.

In addition, disaggregated EV usage coupled with energy specific information (that may be obtained via disaggregation of the whole-house signal, or by associating a user's utility account (rates, etc.) may provide for additional applications. For example, disaggregation systems may be configured to notice and/or recognize any changes in the charging signature (for example, changes in the slope or duration or charging). Such changes—compared to historical patterns of charging—may indicate a particular batter status or issue. An alert may then be send to the user regarding any identified potential battery issues, including but not limited to battery degradation.

Moreover, by utilizing disaggregated data with the user's utility rates, the user may be informed regarding the actual value of using an EV by comparing the real time gas price versus EV charging electricity price. Such data may even take into account time-of-use rate plans that may be applicable to a specific user.

Depending on the additional costs of EV charging, the user may be informed of any different plans offered by an applicable utility that may be more cost effective. For example if the user is not in time-of-use (TOU) rate plan, a recommendation of beneficial rate plans may be provided. Similarly, if the user is in TOU rate plan, information regarding charging compared with time-of-day may be provided, thereby informing the user that if he or she charges the EV in non-peak demand hours, a certain savings may be obtained. This information may be conveyed to the user either through the interfaces discussed above, or even through direct communication such as mail, which may include a reminder of best times to charge (such as a sticker that may be placed in or on the vehicle or the home charging station). In this manner, the burden of charging EVs across a utility network may be shifted to non-peak hours, which may be both more economically advantageous to the user, and preferable by the utility.

Disaggregation information may be used to provide real-time alerts which may include information such as when charging starts, finished, and/or the current charging percent. Similarly, information regarding charging stations may be supplied to the user, including for example, a recommendation of nearest and most cost-effective charging stations and/or monetary savings that may be obtained from the use of such specific charging stations.

Moreover, information generalized for EV makes or models may also be provided to potential consumers of EVS, setting forth potential incentives of value based on gas price and green factors.

It will be understood that the specific embodiments of the present invention shown and described herein are exemplary only. Numerous variations, changes, substitutions and equivalents will now occur to those skilled in the art without departing from the spirit and scope of the invention. Similarly, the specific shapes shown in the appended figures and discussed above may be varied without deviating from the functionality claimed in the present invention. Accordingly, it is intended that all subject matter described herein and shown in the accompanying drawings be regarded as illustrative only, and not in a limiting sense, and that the scope of the invention will be solely determined by the appended claims.

What is claimed is:

1. A method of electronically detecting and disaggregating a consumption signal associated with the charging of an electric vehicle from a whole-house profile, comprising:
    identifying by an electronic processor potential interval candidates of electric vehicle charging, based at least in part upon long and decreasing patterns;
    determining by the electronic processor intervals associated with the charging of an electric vehicle, based at least in part on evaluating each potential interval candidate;
    determining by the electronic processor an initial point of charging for each interval associated with the charging of an electric vehicle; and
    identifying that energy consumption associated with the charging of the electric vehicle occurred, and informing a user of the same.

2. The method of claim 1, wherein the potential interval candidates are identified using sliding windows of various sizes.

3. The method of claim 1, wherein identifying potential interval candidates further comprises using optimization techniques selected from the group consisting of: dynamic programming, alpha-beta pruning, and branch-and-bound algorithms.

4. The method of claim 1, wherein the evaluation of each potential interval candidate comprises fitting each potential interval candidate shape with one or more parametric models.

5. The method of claim 4, further comprising determining goodness-of-fit of each parametric model to determine if each potential interval candidate represents the charging of an electric vehicle.

6. The method of claim 1, wherein the evaluation of each potential interval candidate comprises applying a log-linear model to each potential interval candidate.

7. The method of claim 1, wherein the initial point of charging for each interval associated with the charging of an electric vehicle is determined identifying upward transitions in the whole-house profile.

8. The method of claim 7, further comprising applying signal processing techniques of smoothing, filtering, and/or change-point detecting.

9. The method of claim 1, wherein the feedback may be supervised or semi-supervised.

10. The method of claim 1, wherein the feedback may be received from a user.

11. A method of electronically detecting and disaggregating a consumption signal associated with the charging of an electric vehicle from a whole-house profile, comprising:
    identifying by an electronic processor, based at least in part upon long and decreasing patterns, potential interval candidates of electric vehicle charging using sliding windows of various sizes and optimization techniques including dynamic programming, alpha-beta pruning, and/or branch-and-bound algorithms;
    determining by the electronic processor intervals associated with the charging of an electric vehicle, based at least in part on evaluating each potential interval candidate by fitting each potential interval candidate shape with one or more parametric models;
    determining by the electronic processor an initial point of charging for each interval associated with the charging of an electric vehicle based at least in part upon identifying upward transitions in the whole-house profile and applying signal processing techniques;

receiving feedback from a user of the electric vehicle; and identifying that energy consumption associated with the charging of the electric vehicle occurred, and informing a user of the same.

12. The method of claim 1, wherein the parametric models comprise a log-linear model.

13. The method of claim 1, wherein the signal processing techniques are selected from the group consisting of smoothing, filtering, and change-point detecting.

14. A method of electronically detecting and disaggregating a consumption signal associated with the partial charging of an electric vehicle from a whole-house profile, comprising:

identifying by an electronic processor potential interval candidates of electric vehicle charging, based at least in part upon features characteristic of previously determined electric vehicle charging;

determining by the electronic processor intervals associated with the charging of an electric vehicle, based at least in part on evaluating each potential interval candidate;

determining by the electronic processor an initial point of charging for each interval associated with the charging of an electric vehicle; and identifying that energy consumption associated with the charging of the electric vehicle occurred, and informing a user of the amount of energy consumption associated with the charging of the electric vehicle.

15. The method of claim 1, wherein the features characteristic of previously determined electric vehicle charging may be selected from the group consisting of: amplitude interval candidates, duration of interval candidates, and time-of-day of interval candidates.

16. A system for detecting and disaggregating a consumption signal associated with the charging of an electric vehicle from a whole-house profile, comprising:

a candidate search module, configured to identify potential interval candidates of electric vehicle charging, based at least in part upon long and decreasing patterns;

a parametric fitting module, configured to determine intervals associated with the charging of an electric vehicle, based at least in part on evaluating each potential interval candidate by fitting each potential interval candidate shape with one or more parametric models;

an initial point detection module, configured to determine an initial point of charging for each interval associated with the charging of an electric vehicle; and a feedback module, configured to receive feedback associated with detected signals.

17. The system of claim 16, wherein the candidate search module utilizes sliding windows of various sizes and optimization techniques including dynamic programming, alpha-beta pruning, and/or branch-and-bound algorithms.

18. The system of claim 16, wherein the initial point detection module determines initial points based at least in part upon identifying upward transitions in the whole-house profile and applying signal processing techniques.

19. The system of claim 16, wherein the feedback module receives supervised and semi-supervised feedback.

20. A method of electronically detecting and disaggregating a consumption signal associated with the charging of an electric vehicle from a whole-house profile, comprising:

identifying by an electronic processor potential interval candidates of electric vehicle charging, based at least in part upon identifying box-shaped energy usage patterns;

determining by the electronic processor intervals associated with the charging of an electric vehicle, based at least in part on evaluating each potential interval candidate against factors including amplitude, duration, and time-of-day; and identifying that energy consumption associated with the charging of the electric vehicle occurred, and informing a user of the amount of energy consumption associated with the charging of the electric vehicle.

21. The method of claim 20, further comprising:

determining certain household appliances within the home an disaggregating energy usage associated with such certain household appliances; and wherein the step of determining intervals associated with the charging of an electric vehicle further comprises eliminating from potential interval candidates candidate who are have profiles associated with certain household appliances.

22. The method of claim 21, wherein certain household appliances within the home are determined based upon non-intrusive load monitoring.

23. The method of claim 21, wherein the certain household appliances within the home are determined based information provided by a user.

24. The method of claim 21, wherein the certain household appliances may be selected from the group consisting of: refrigerator, pool pump, sump pump, and heating, ventilation, and air-conditioning (HVAC) unit.

* * * * *